(12) United States Patent
Carpenter

(10) Patent No.: US 10,536,162 B2
(45) Date of Patent: Jan. 14, 2020

(54) METHOD AND SYSTEM TO CONVERT GLOBALLY UNIQUE IDENTIFIERS TO ELECTRONIC DATA INTERCHANGE DOCUMENT IDENTIFIERS

(71) Applicant: DELL PRODUCTS, L.P., Round Rock, TX (US)

(72) Inventor: Donal Carpenter, Wicklow (IE)

(73) Assignee: Dell Products, L.P., Round Rock, TX (US)

(*) Notice: Subject to any disclaimer, the term of this patent is extended or adjusted under 35 U.S.C. 154(b) by 259 days.

(21) Appl. No.: 15/418,908

(22) Filed: Jan. 30, 2017

(65) Prior Publication Data
US 2018/0219964 A1    Aug. 2, 2018

(51) Int. Cl.
*G06F 15/16*   (2006.01)
*H03M 7/12*    (2006.01)
*H03M 7/30*    (2006.01)

(52) U.S. Cl.
CPC ............... *H03M 7/12* (2013.01); *H03M 7/30* (2013.01); *H03M 7/3088* (2013.01)

(58) Field of Classification Search
CPC .............................. H03M 7/30; H03M 7/3088
See application file for complete search history.

(56) References Cited

U.S. PATENT DOCUMENTS

| | | | | | |
|---|---|---|---|---|---|
| 5,913,217 A | * | 6/1999 | Alger | ................... | G06F 16/9014 |
| | | | | | 713/502 |
| 7,650,353 B2 | * | 1/2010 | Machiraju | ........... | G06F 17/2247 |
| | | | | | 707/999.101 |
| 8,744,999 B2 | * | 6/2014 | Clarke | ..................... | G06F 16/93 |
| | | | | | 707/625 |
| 9,058,392 B1 | * | 6/2015 | Pennock | ............. | G06F 16/9535 |
| 2003/0131071 A1 | * | 7/2003 | Bennett | .................... | G06Q 10/10 |
| | | | | | 709/218 |
| 2003/0140048 A1 | * | 7/2003 | Meier | .................... | G06Q 10/06 |
| 2007/0239802 A1 | * | 10/2007 | Razdow | .................. | G06F 16/93 |
| 2013/0198155 A1 | * | 8/2013 | Clarke | .................... | G06F 16/93 |
| | | | | | 707/696 |
| 2013/0218739 A1 | * | 8/2013 | Kmiec | .................. | G06Q 40/04 |
| | | | | | 705/37 |
| 2018/0005227 A1 | * | 1/2018 | Sandelov | ......... | G06Q 20/38215 |

OTHER PUBLICATIONS

Atwood, Jeff, "Equipping our ASCII Armor", coding Horror, http://twitter.com/codinghorror, Oct. 6, 2005 (Year: 2005).*
Atwood, Jeff, "Equipping our ASCII Armor", Coding Horror, http://twitter.com/codinghorror, Oct. 6, 2005.

* cited by examiner

*Primary Examiner* — Dhairya A Patel
(74) *Attorney, Agent, or Firm* — Isidore PLLC

(57) ABSTRACT

A method and information handling system (IHS) converts a globally unique identifier to an electronic data interchange document identifier. The method includes receiving a globally unique identifier and converting the globally unique identifier into 128 binary bits. The 128 binary bits are selectively separated to form groups of bits that translate to integers. Each integer is replaced with an assigned alphanumeric character selected from an alphanumeric character map to form an encoded alphanumeric string of characters for use as an electronic data interchange document identifier.

17 Claims, 6 Drawing Sheets

METHOD AND SYSTEM TO CONVERT GLOBALLY UNIQUE IDENTIFIERS TO ELECTRONIC DATA INTERCHANGE DOCUMENT IDENTIFIERS

BACKGROUND

1. Technical Field

The present disclosure generally relates to electronic data interchange in information handling systems (IHSs) and in particular to unique identifiers for electronic data interchange in IHSs.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are utilized to perform the autonomous operations of electronic data interchange. Electronic Data Interchange (EDI) is a communication between electronic systems that enable entities to exchange information electronically rather than with paper. These business entities, or trading partners, transfer information in a standardized format, often from a seller's information handling system to the customer's information handling system. By adhering to the same standardized format, trading partners, even in two different countries, can electronically exchange documents (e.g. purchase orders, invoices, shipping notices, and other documents).

The electronic data interchange standard requires electronic data interchange documents to have an identifier. It is beneficial to each trading partner that their identifier be unique and undecipherable to a security threat. According to the EDI standard, the identifier should not exceed 30 characters. Globally unique identifiers, or universally unique identifiers, have widespread use in software engineering as a means of generating an identifier with reliable uniqueness globally. These globally unique identifiers are often utilized as correlation identification between distributed systems. However, even with all hyphenation removed, globally unique identifiers are 32 characters long and are thereby unacceptable for use as an electronic data interchange document identifier.

BRIEF SUMMARY

Disclosed are an information handling system (IHS) and a method performed within an IHS for converting a globally unique identifier to an electronic data interchange document identifier. The method includes receiving a globally unique identifier and converting the globally unique identifier into 128 binary bits. The method then includes selectively grouping the 128 binary bits to form groups of a select number of bits that translate to integers and replacing each integer with an assigned alphanumeric character. Each of the assigned alphanumeric characters are selected from an alphanumeric character map to form an encoded alphanumeric string of characters that function as a unique electronic data interchange document identifier.

According to another embodiment, the IHS includes a storage device that is utilized to store electronic data exchange software. A processor is communicatively coupled to the storage device, and has a globally unique identifier conversion utility that executes on the processor to enable conversion of a globally unique identifier to an electronic data interchange unique identifier. The globally unique identifier conversion utility configures the processor to generate an alphanumeric character map and an array of unsigned integers. In response to generating the alphanumeric character map and the array of unsigned integers, the globally unique identifier conversion utility assigns an alphanumeric character of the alphanumeric character map to an unsigned integer, selected from among the array of unsigned integers. The processor receives a generated globally unique identifier, and the globally unique identifier conversion utility converts the generate globally unique identifier into 128 binary bits. The 128 binary bits are selectively grouped to form groups of bits that translate to a series of integers. The globally unique identifier conversion utility replaces each unsigned integer with an alphanumeric character to form an encoded alphanumeric string of characters based on an established association between the unsigned integers and an alphanumeric character map. The encoded alphanumeric string of characters function as a unique electronic data interchange document identifier.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements.

Embodiments incorporating teachings of the present disclosure are shown and described with respect to the figures presented herein, in which.

DETAILED DESCRIPTION

Figure 1:
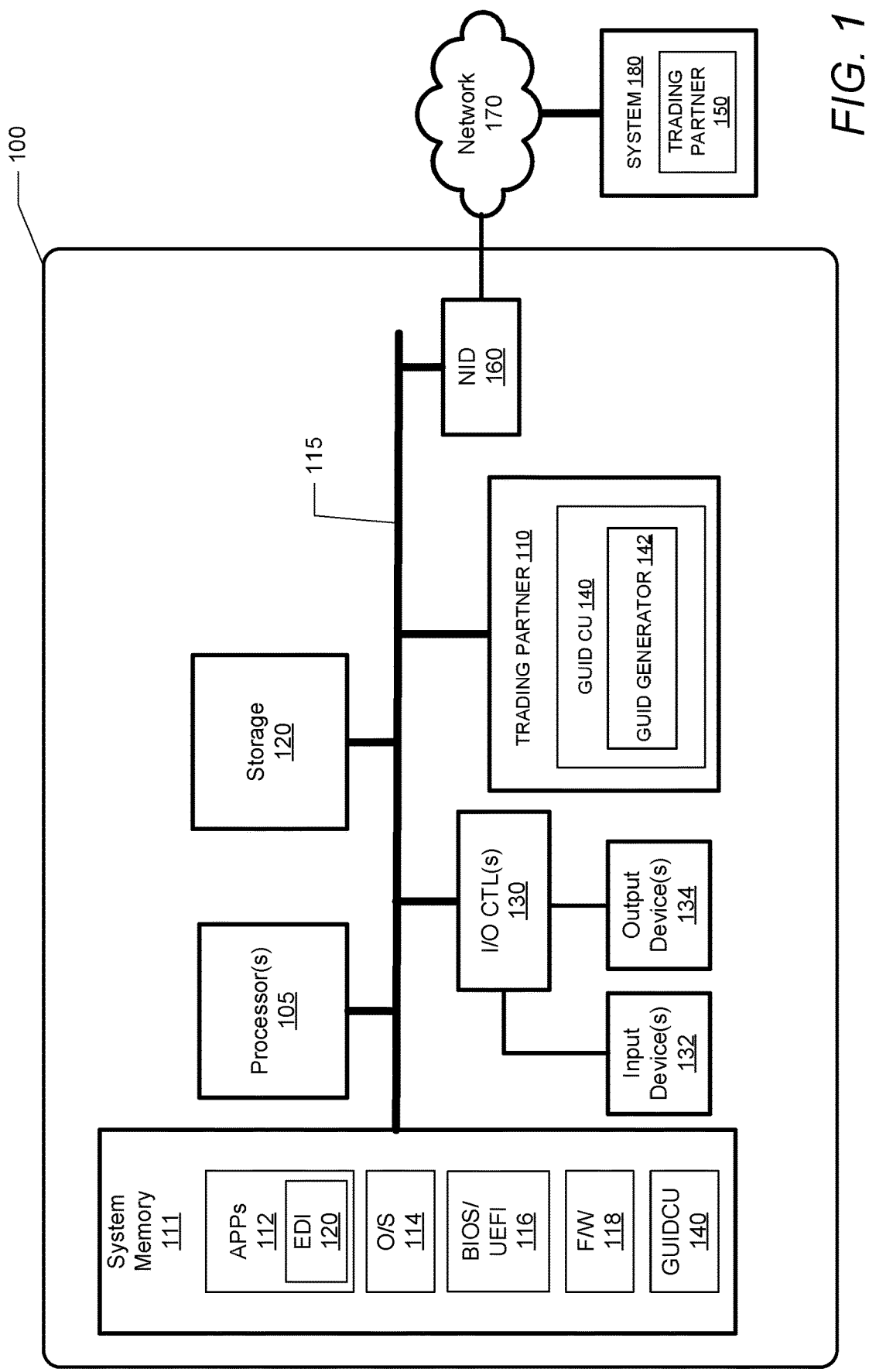
FIG. 1 illustrates an example information handling system within which various aspects of the disclosure can be implemented, according to one or more embodiments.

The illustrative embodiments provide an information handling system (IHS) and a method performed within the information handling system for converting a globally unique identifier to an electronic data interchange document identifier. The method includes receiving a globally unique identifier and converting the globally unique identifier into 128 binary bits. The 128 binary bits are selectively separated to form groups of bits that translate to a series of integers. The globally unique identifier conversion utility replaces each unsigned integer with an alphanumeric character to form an encoded alphanumeric string of characters based on an established association between the unsigned integers and an alphanumeric character map. The encoded alphanumeric string of characters function as a unique electronic data interchange document identifier.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Those of ordinary skill in the art will appreciate that the hardware, firmware/software utility, and software components and basic configuration thereof depicted in the following figures may vary. For example, the illustrative components of IHS 100 are not intended to be exhaustive, but rather are representative to highlight some of the components that are utilized to implement certain of the described embodiments. For example, different configurations of an IHS may be provided, containing other devices/components, which may be used in addition to or in place of the hardware depicted, and may be differently configured. The depicted example is not meant to imply architectural or other limitations with respect to the presently described embodiments and/or the general invention.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes one or more processor(s) 105 coupled to system memory 111 via system interconnect 115. System interconnect 115 can be interchangeably referred to as a system bus, in one or more embodiments. Also coupled to system interconnect 115 is storage 120 within which can be stored one or more software and/or firmware modules and/or data (not specifically shown). In one embodiment, storage 120 can be hard drive or a solid state drive. The one or more software and/or firmware modules within storage 120 can be loaded into system memory 111 during operation of IHS 100. As shown, system memory 111 can include therein a plurality of software and/or firmware modules including application(s) 112, operating system (O/S) 114, basic input/output system/unified extensible firmware interface (BIOS/UEFI) 116, other firmware (F/W) 118, as well as globally unique identifier conversion utility (GUID CU) 140. Applications 112 include electronic data interchange (EDI) software to provide a standardized format for processing and electronically interchanging business information. The various software and/or firmware modules have varying functionality when their corresponding program code is executed by processor(s) 105 or other processing devices within IHS 100. IHS 100 further includes one or more input/output (I/O) controllers 130 which support connection by, and processing of signals from, one or more connected input device(s) 132, such as a keyboard, mouse, touch screen, or microphone. I/O controllers 130 also support connection to and forwarding of output signals to one or more connected output devices 134, such as a monitor or display device or audio speaker(s).

IHS 100 further comprises a network interface device (NID) 160. NID 160 enables IHS 100 to communicate and/or interface with other devices, services, and components that are located external to IHS 100. These devices, services, and components can interface with IHS 100 via an external network, such as example network 170, using one or more communication protocols. In one embodiment, a customer provisioned system/platform can comprise multiple devices located across a distributed network, and NID 160 enables IHS 100 to be connected to these other devices. For example, system 180 communicates with IHS 100 via network 170. System 180 includes trading partner 150 as a software module within system 180 and IHS 100. EDI software associated with first trading partner 110 and second trading partner 150 enables automated data exchange between first trading partner 110 and second trading partner 150. Network 170 can be a local area network, wide area network, personal area network, and the like, and the connection to and/or between network and IHS 100 can be wired or wireless or a combination thereof. For purposes of discussion, Network 170 is indicated as a single collective component for simplicity. However, it is appreciated that network 170 can comprise one or more direct connections to other devices as well as a more complex set of interconnections as can exist within a wide area network, such as the Internet.

In one embodiment GUID CU 140 is a separate software utility that is stored within trading partner module 110. During boot-up or booting operations of IHS 100, processor 105 selectively loads GUID CU 140 to system memory 111. In one or more embodiments, GUID CU 140 includes globally unique identifier (GUID) generator 142, which provides the additional functionality associated with generating a GUID. In one embodiment, processor 105 executes GUID CU 140 to enable conversion of a GUID to a unique identifier. GUID generator 142 generates a GUID. Additional aspects of GUID CU 140 and functionality associated thereof, are presented within the description of FIGS. 2-6.

Figure 2:
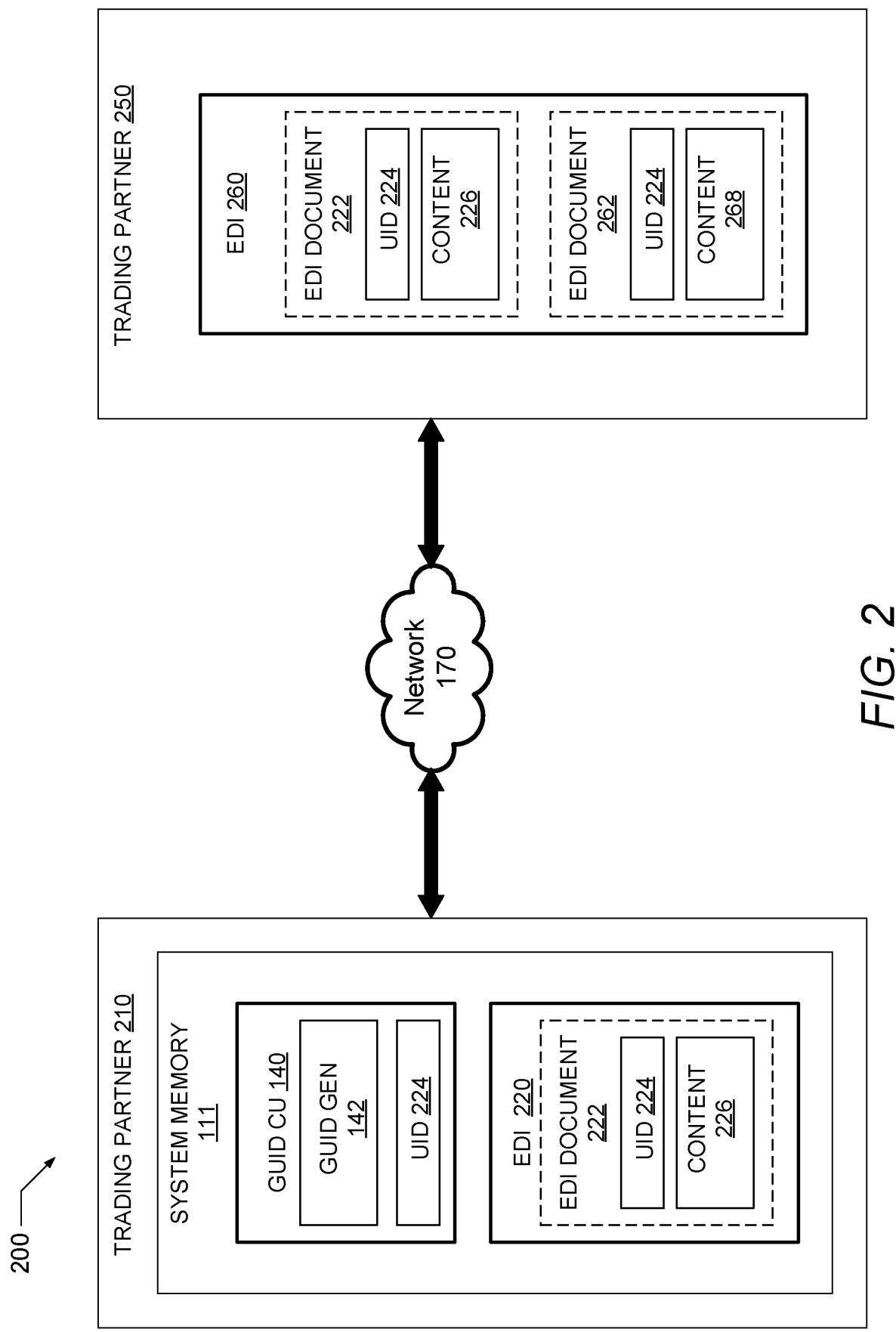
FIG. 2 illustrates example contents of a system memory of the example information handling system operating as a participant in an electronic data interchange network, in accordance with one embodiment.

With reference now to FIG. 2, there is illustrated example hardware and firmware/software components of FIG. 1 that are utilized within EDI network 200 for EDI between trading partners. EDI network 200 includes first trading partner 210 and second trading partner 250. First trading partner 210 has access to system memory 111 which is a storage device storing EDI software 220. First and second trading partners 210 and 250 communicate via network 170, where network 170 can be a local area network, wide area network, personal area network, or other type of electronic communication network.

In operation, first trading partner 210 generates EDI document 222 via GUID CU 140 working in conjunction with EDI software 220. EDI document 222 may be, for example, a purchase order, invoice, shipping notice, as well as other notices or classified information. EDI document 222 is an outbound document. As an outbound document, EDI document 222 is sent from first trading partner 210 to second trading partner 250 using the protocols of a known EDI standard (e.g. American National Standards Institute X12 EDI standard, United Nations rules for Electronic Data Interchange for Administration, Commerce and Transport (UN/EDIFACT) standard, etc). According to the general EDI standards, each EDI document 222 originating from first trading partner 210 should include a document identifier, in this instance, UID 224. First trading partner 210 generates a GUID string of characters utilizing GUID generator 142. The GUID string of characters is processed to generate a document identifier that conforms to the EDI standard protocol. UID 224 is used to uniquely identify each outbound EDI document, distinctively correlating the contents of the request to the transmitting entity. UID 224 is embedded in a transmission identifier field of EDI document 222 and remains with EDI document 222 as EDI document 222 is transmitted throughout EDI network 200. Accordingly, UID 224 is utilized to track and/or monitor the activity uniquely associated with EDI document 222.

EDI document 222 is transferred to second trading partner 250. Second trading partner 250 receives EDI document 222 as an inbound document. In response to receiving EDI document 222, second trading partner 250 generates a corresponding outbound EDI document 262 that retains the same document identifier, UID 224. Second trading partner 250 may generate revisions to EDI document 222, represented as content 268 within EDI document 262. To be acknowledged by first trading partner 210, EDI document 262 must include an uncompromised UID 224.

In one example, first trading partner 210 generates a GUID and associates the GUID with a purchase order. The GUID is only known to first trading partner 210. The purchase order and GUID are saved to a database. EDI software 220 generates EDI document 222 to be sent to second trading partner 250. EDI software 220, of first trading partner 210, translates the purchase order content and GUID to meet EDI standards. Contents 226 of EDI document 222 reflect the contents of the purchase order. GUID CU 140 processes the generated GUID to form UID 224. UID 224 and contents 226 are associated with EDI document 222. In one embodiment, the originally generated GUID is utilized to locate the original purchase order; therefore UID 224 is reversed processed. In response to first trading partner 210 receiving a corresponding or a responsive EDI document 262 from second trading partner 250, GUID CU 140 decodes UID 224 to determine if the decoded string of characters is equivalent to the GUID that was originally generated for EDI document 222. If the decoded UID 224 matches the originally generated GUID, EDI document 262 is accepted by first trading partner 210 and GUID CU 140 is able to validate authenticity of EDI document 262. Otherwise, EDI document 262 is rejected and/or further reviewed before reception is considered.

In one embodiment, a GUID is generated for use as an identifier in an application program interface (API). In one form, API is a messaging format that enables data to be transmitted from a first system (trading partner 210) to a second system (trading partner 250). API's typically provide access to the data of a single user at a time. An external program that attempts to use the API must specify which user they represent by means of a GUID. Although unique, GUIDs are not random and provide some insight to time and space of creation. Therefore, in an effort to conceal information provided in a generated GUID, an API and/or a counterpart application utilizes GUID CU 140 to compress and encode the GUID, forming UID 224.

It is understood that reference to the use of the encoded document identifier as an EDI document identifier is merely one example for use of a compressed GUID. The processes discussed herein to compress the GUID for use as an encoded document identifier is suitable for use in a multiplicity of capacities. For example, the processes are suitable for use in API communication, business-to-consumer e-commerce transactions, and business-to-business e-commerce transaction. Encoded document identifiers are used to conceal GUID information, compress GUID strings, as well as provide an alternative identity to a GUID when utilized in public domains.

EDI document identifiers that utilize patterns and/or known base identifier strings may be prone to hacks or security breaches. Generating a unique document identifier for each outbound EDI document provides increased security against potential hackers and/or network attacks.

Figure 3:
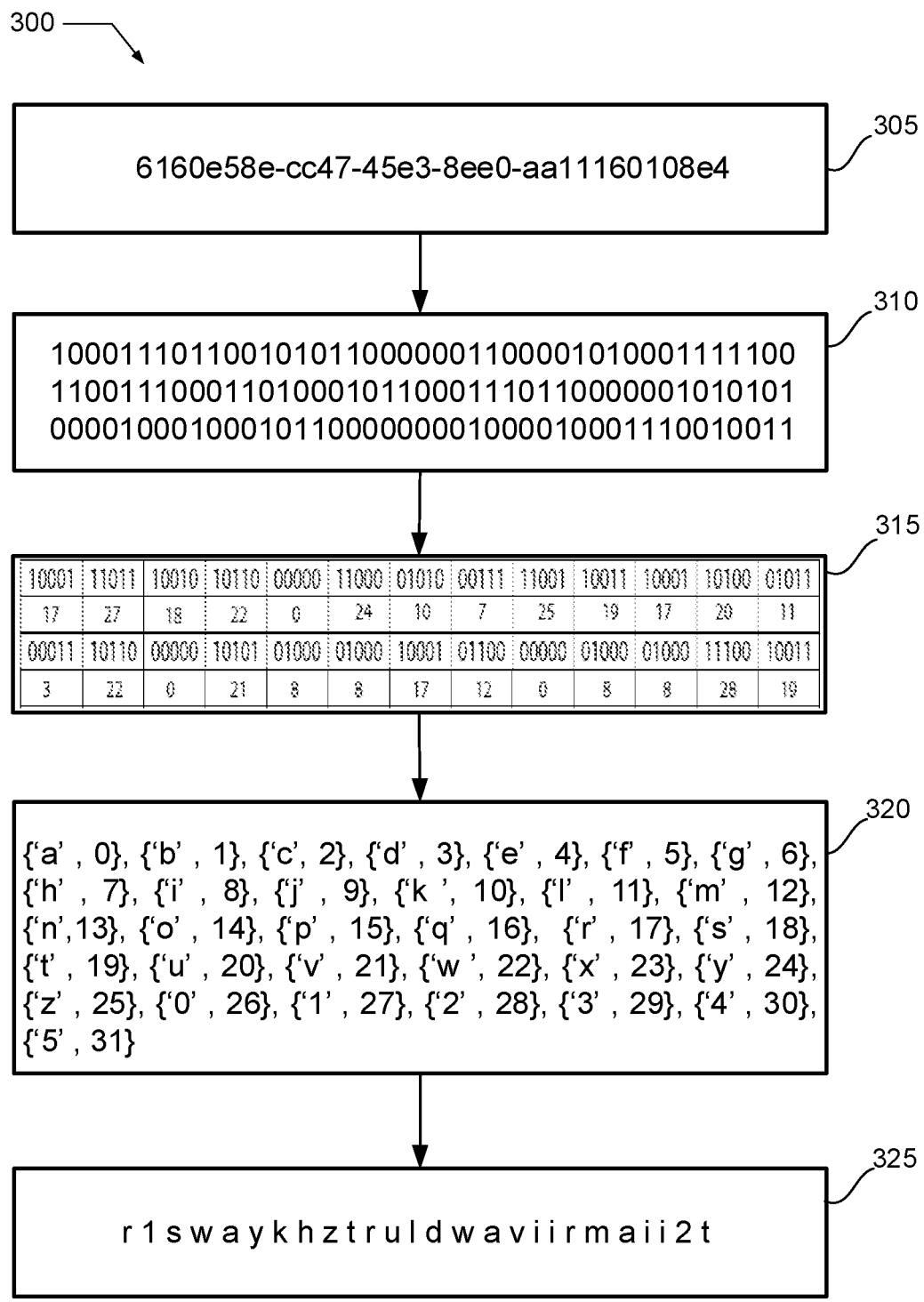
FIG. 3 is a diagram illustrating the conversion of a globally unique identifier from a 32-character string identifier to an encoded electronic data interchange document identifier, in accordance with one embodiment.

FIG. 3 illustrates the process by which IHS 100 converts GUID 305 from a 32-character string identifier to an EDI document identifier. Encoding steps 300 involve the use of GUID 305, binary ID 310, integer conversion table 315, alphanumeric character map 320, and encoded document identifier 325. Alphanumeric character map 320 is a derived number of characters in length. GUID CU 140 derives the number of characters from an algorithm that divides the total number of binary bits forming a GUID by the total number of characters allowed in the electronic document identifier to obtain the number of binary bits per group. GUID CU 140 raises the number of binary bits per group to the power of two, to obtain the number of different characters in length for forming alphanumeric character map 320.

Per EDI document standards, a document identifier is a string of 30 or less characters. GUID 305 includes 32 alphanumeric characters. When converted to raw binary bits, GUID 305 becomes binary ID 310, a 128-string of binary bits. In this example, GUID CU 140 utilizes an algorithm to convert the raw 128 bits of GUID 305 to an alphanumeric string with a maximum length of 30 characters. The number of binary bits, 128, are divided by the maximum number of characters allowed in the document identification field (i.e., 30) to determine the character length of a custom alphabet string. The custom alphabet, in this example, contains 5 bit words; therefore 32 different characters are suggested to represent all possible 5-bit combinations. The 128 string of binary bits are separated into groups of five, with two known bits being added to the last group to create a complete grouping of five.

Integer conversion table 315 illustrates binary ID 310 selectively separated into groups of five, forming 26 groups of five bits. Each group of five is individually evaluated and converted to the integer equivalent (between 0 and 31). Alphanumeric character map 320 is utilized as an index which points each integer to a corresponding alphabet or numeric character. The custom alphanumeric character map can include an infinite selection of upper and lower case alphanumeric combinations. For simplicity, 26 lower case standard alphabet characters and the numbers 0 to 5 inclusive, are selected to create the character array of 32 characters or less, in one embodiment. Each integer from integer conversion table 315 is selectively paired with a corresponding alphabet character or number within alphanumeric character map 320, to form an index of paired characters that are less than or equal to 32 character pairs. The paired characters are stored. From the paired characters a GUID CU 140 forms a less than 30-character encoded document identifier 325. Various numbers and iterations of this algorithm can be adapted to optionally form a valid unique EDI document identifier of 30 characters or less. According to one aspect, alphanumeric character map 320 is stored within system memory 111. GUID CU 140 accesses alphanumeric character map 320 during subsequent decoding.

In one embodiment, GUID generator 142 generates GUID 305. GUID CU 140 receives GUID 305 and converts GUID 305 to binary id 310. GUID CU 140 selectively groups the 128 binary bits of binary id 310 into a select number of bits that translate to integers. As described above in the provided example, the 128 string of binary bits are separated into groups of five, with a predetermined number of one bits (i.e. two known bits) being added to the last group to create a complete grouping of five; thereby yielding 26 groups. Each group of five binary bits are translated into its decimal equivalent. GUID CU 140 generates a custom alphanumeric character array to be indexed with a sequential array of unsigned integers. GUID CU 140 assigns an alphanumeric character (of the custom alphanumeric character array) to each respective integer in the array of unsigned integers, generating alphanumeric character map 320. The array of unsigned integers is an incremental array from 0 to 31. GUID CU 140 replaces each integer with an assigned alphanumeric character selected from alphanumeric character map 320, forming an encoded alphanumeric string of 30 or less characters, or encoded document ID 325. GUID CU 140 assigns encoded document ID 325 to an electronic data interchange document (e.g. EDI document 222), as an embedded document identifier. Encoded document ID 325 is a unique, randomly generated document identifier. Encoded document ID 325 is a string of 30 or less characters originally derived from a generated GUID and remains with EDI document 222 throughout the duration of the EDI processing.

Figure 4:
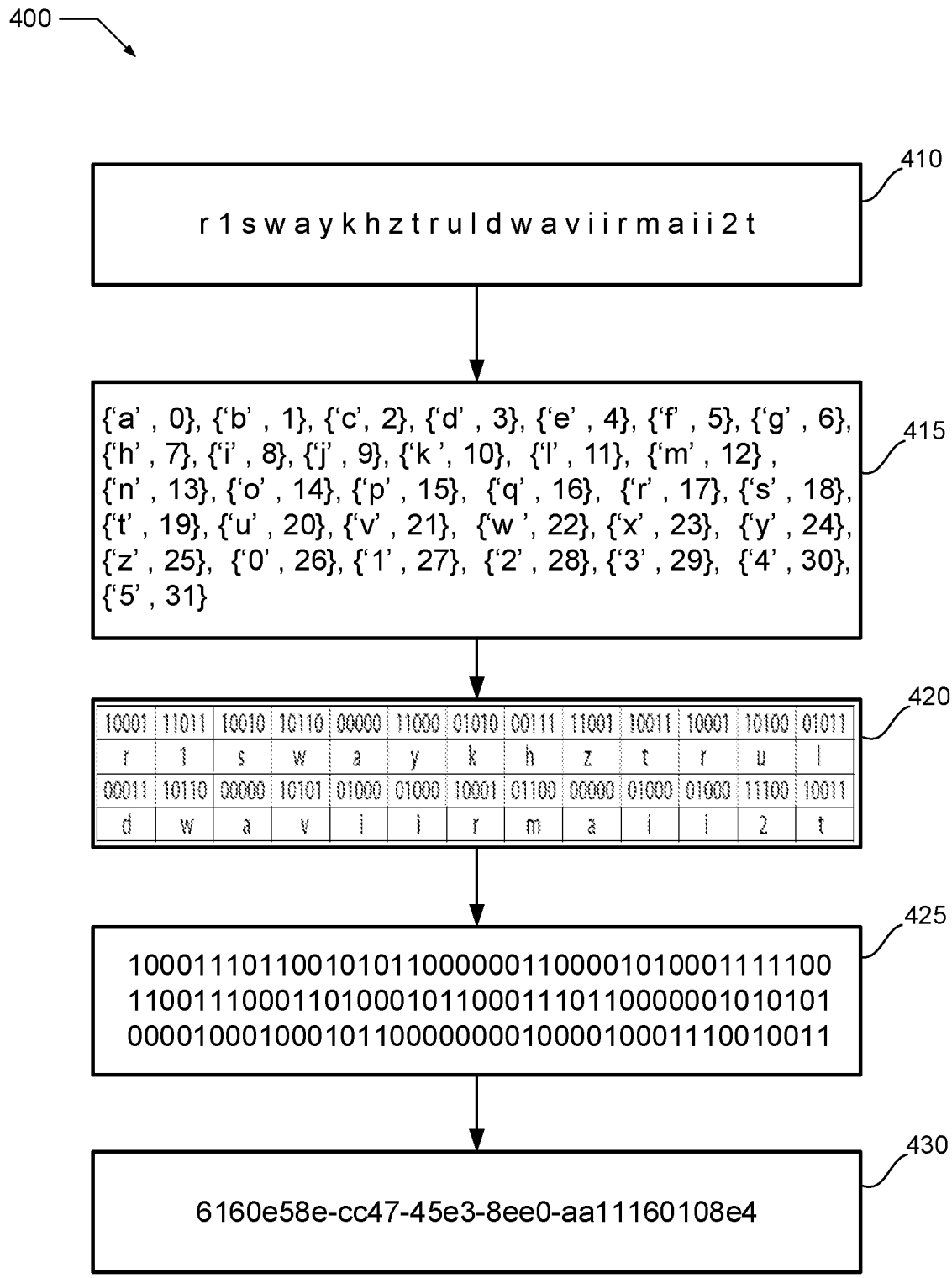
FIG. 4 is a diagram illustrating the conversion of an encoded electronic data interchange document identifier to a decoded globally unique identifier, in accordance with one embodiment.

FIG. 4 illustrates the decoding of an encoded electronic data interchange document identifier to the originally generated GUID. Decoding steps 400 involve the use of encoded document ID 410, alphanumeric character map 415, conversion table 420, binary ID 425, and GUID 430.

In one embodiment, GUID 305 (of FIG. 3) uniquely identifies a purchase order or similar document established by a first trading partner. GUID 305 is only known by the device that generates it; therefore, to trace the purchase order associated with the EDI document, encoded document ID 325 is decoded to divulge the originally generated GUID. EDI software of IHS 100 (FIG. 1) receives an EDI document. EDI document includes encoded document ID 410 imbedded within the EDI document. Encoded document ID 410 is retrieved and decoded to determine the originally generated GUID. GUID CU 140 retrieves the stored paired index that forms alphanumeric character map 415. Each letter of encoded document ID 410 is indexed back to alphanumeric character map 415. For each alphanumeric character of encoded document ID 410, GUID CU 140 replaces the alphanumeric character with the corresponding unsigned integer. Then each of the unsigned integers is replaced with the binary equivalent, which becomes a string of 130 binary bits. GUID CU 140 removes the ending two binary bits forming a 128 bit binary string. GUID CU 140 deciphers the four-bit hexadecimal equivalent of the 128 bit binary string to form the originally generated GUID, GUID 430. The decoded GUID is cross-referenced with originally generated GUIDs to determine if a match exist. If a match is found, GUID CU 140 retrieves the associated purchase order (or similar document).

In another embodiment, the originally generated GUID is indexed to the encoded EDI document identifier and stored in a table/mapping of generated GUIDs and their associated encoded EDI document identifier. When first trading partner 210 receives EDI document 262 from second trading partner 250, GUID CU 140 compares the received EDI document identifier to the indexed document identifier to determine the originally generated GUID.

Figure 5:
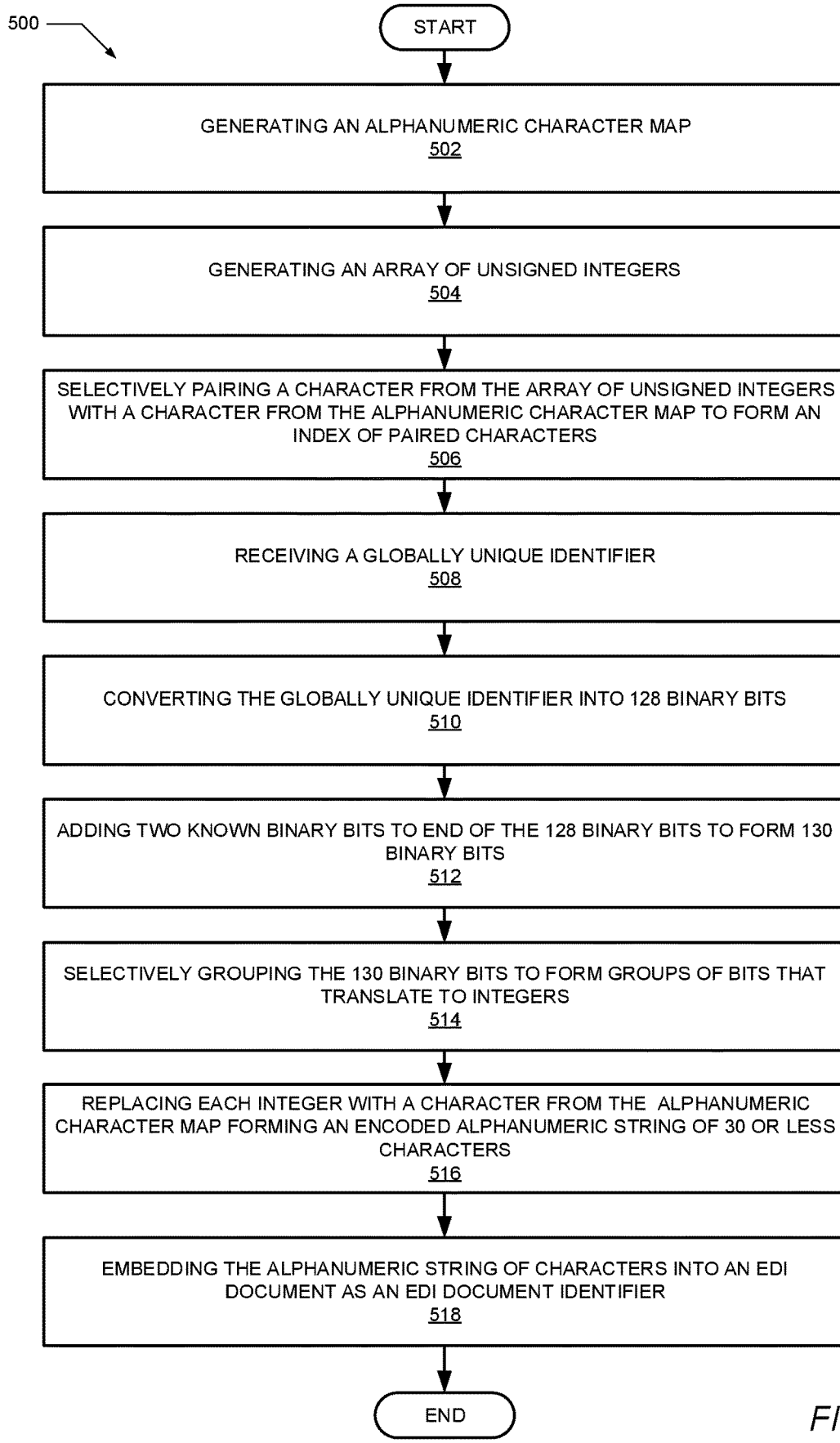
FIG. 5 is a flow chart illustrating an example of a method for converting a globally unique identifier to an electronic data interchange document identifier according to one or more embodiments.
Figure 6:
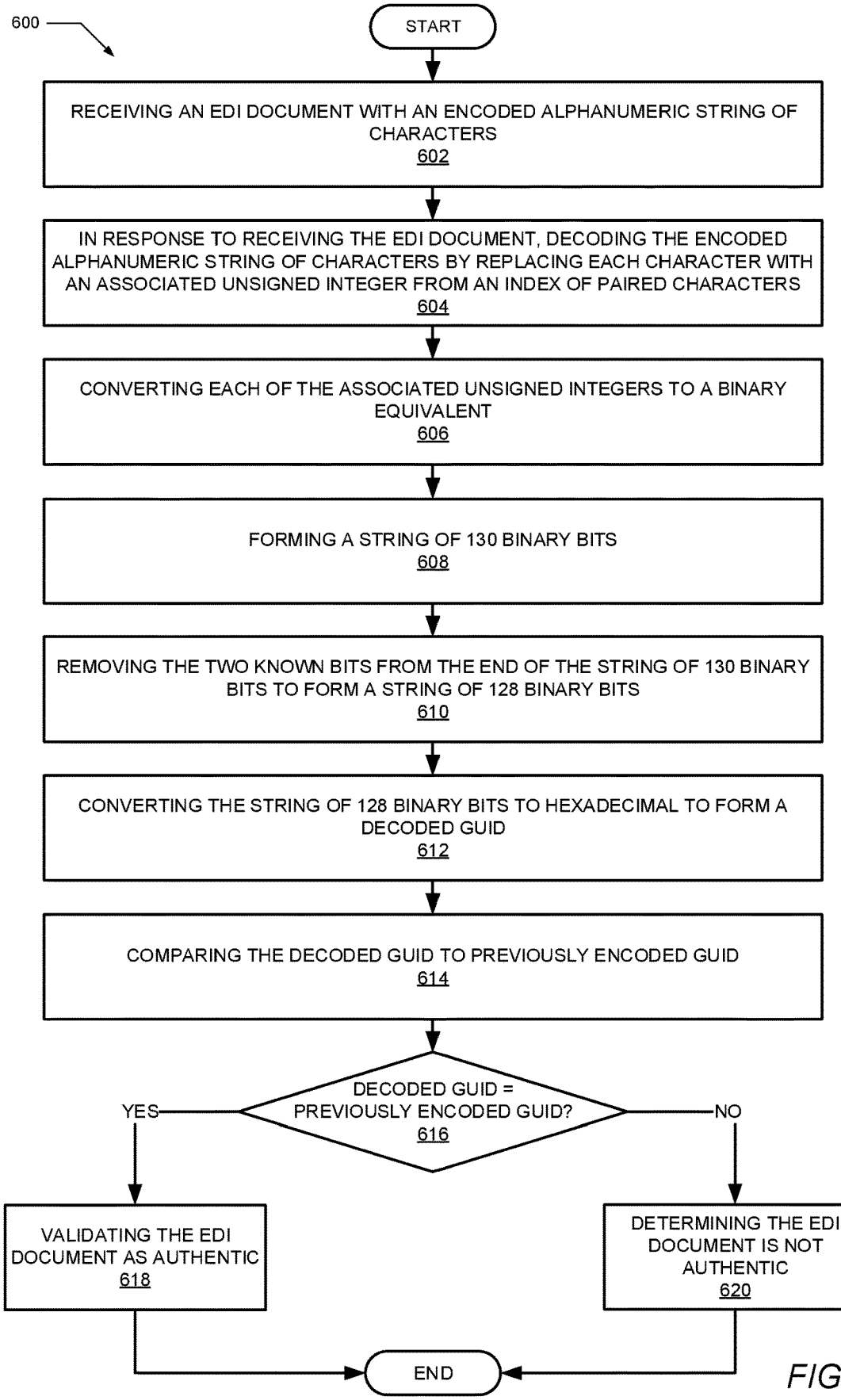
FIG. 6 is a flow chart illustrating another example of a method for converting an electronic data interchange document identifier to a globally unique identifier according to one or more embodiments.

FIGS. 5 and 6 illustrate flowcharts of exemplary methods 500 and 600 by which processor 105 and GUID 140 within the preceding figures performs different aspects of the processes that enable the one or more embodiments of the disclosure. Generally, methods 500 and 600 represent computer-implemented methods for converting a GUID to an electronic data interchange document identifier, and a method for converting an electronic data interchange document identifier to a globally unique identifier. The description of methods 500 and 600 are provided with general reference to the specific components illustrated within the preceding FIGS. 1-4. Generally, methods 500 and 600 are described as being implemented via processor 105 and particularly the execution of code provided by GUID CU 140. It is however appreciated that certain aspects of the described methods may be implemented via other processing devices and/or execution of other code.

Referring now to FIG. 5, method 500 begins at the start block and proceeds to block 502 where the method includes generating an alphanumeric character array. Method 500 proceeds to block 504, at which processor 105 generates an array of unsigned integers. Following the generating of the alphanumeric character array and the array of unsigned integers, method 500 includes processor 105 selectively pairing a character from the array of unsigned integers with a character from the alphanumeric character map to form an index of paired characters that are less than or equal to 32 character pairs, at block 506. Method 500 includes receiving a generated GUID at block 508. At block 510, the method includes converting, via processor 105, the GUID into 128 binary bits. The method includes adding an additional two known bits at the end of the 128 binary bit string (block 512) and selectively grouping the resulting 130 binary bits into groups of bits that translate to integers (block 514). The method includes replacing each integer with a character from the alphanumeric character map, forming an encoded alphanumeric string of 30 or less characters (block 516). The method then includes processor 105 embedding the alphanumeric string of characters into an EDI document as an EDI document identifier (block 518). The method concludes at the end block.

Turning now to FIG. 6, method 600 begins at the start block and proceeds to block 602. At block 602, the method includes receiving an EDI document with an encoded alphanumeric string of characters. Method 600 proceeds to block 604, at which, in response to receiving the EDI document, processor 105 initiates decoding the encoded alphanumeric string of characters by replacing each character with an associated unsigned integer from an index of paired characters. Method 500 includes processor 105 converting each of the associated unsigned integers to a binary equivalent. At block 608, the method includes forming a string of 130 binary bits. Method 600 includes removing the two known bits from the end of the 130 string of binary bits to form a string of 128 binary bits (block 610). At block 612, the method includes converting the string of 128 binary bits to hexadecimal to form a decoded GUID. The method includes comparing the decoded GUID to the previously encoded GUID (block 614). At block 616, a determination is made whether the decoded GUID is equivalent to the previously encoded GUID. In response to the decoded GUID being equivalent to the previously encoded GUID, the process continues to block 618. At block 618, the method includes validating the EDI document as authentic. In response to the decoded GUID not being equivalent to the previously encoded GUID, the process continues to block 620. At block 620, the method includes determining the EDI document is not authentic. The method concludes at the end block.

In the above described flow charts, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

Where utilized herein, the terms "tangible" and "non-transitory" are intended to describe a computer-readable storage medium (or "memory") excluding propagating electromagnetic signals; but are not intended to otherwise limit the type of physical computer-readable storage device that is encompassed by the phrase "computer-readable medium" or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   receiving a generated globally unique identifier (GUID) at an information handling system (IHS);
   converting, via a processor of the IHS, the globally unique identifier into 128 binary bits;
   adding bits at an end of the 128 binary bits to generate a longer sequence of binary bits;
   selectively grouping the longer sequence of binary bits to form groups of a select number of bits that translate to integers;
   replacing each integer with an assigned alphanumeric character selected from an alphanumeric character map to form an encoded alphanumeric string of characters that comprises 30 or less characters in length, the encoded alphanumeric string of characters conforming to an electronic data interchange (EDI) standard protocol to function as a unique EDI document identifier;
   assigning the encoded alphanumeric string of characters as the unique EDI document identifier to an EDI document;
   embedding, by the processor, the unique EDI document identifier within the EDI document;
   transmitting, by the processor via a network interface device, the EDI document through an EDI network to an electronic system of a trading partner, the EDI document having the unique EDI document identifier embedded therein;
   indexing the generated GUID to an encoded EDI document identifier;
   storing the indexed generated GUID and encoded EDI document identifier within a table/mapping of generated GUIDs and associated encoded EDI document identifiers; and
   in response to receiving an EDI document from the trading partner, comparing the received EDI document identifier to the indexed document identifier to determine an originally generated GUID.

2. The method of claim 1, further comprising:
generating the alphanumeric character map;
generating an array of unsigned integers; and
assigning an alphanumeric character of the alphanumeric character map to an unsigned integer selected from among the array of unsigned integers.

3. The method of claim 2, wherein the array of unsigned integers is a sequential array of unsigned integers.

4. The method of claim 1, wherein the alphanumeric character map is a derived number of characters in length.

5. The method of claim 1, further comprising:
selectively adding a predetermined number of one bits to the 128 binary bits to form 130 binary bits.

6. The method of claim 5, further comprising:
converting every five binary bits to an integer.

7. The method of claim 5, further comprising:
deciphering a four-bit hexadecimal equivalent to the globally unique identifier from the 128 binary bits.

8. The method of claim 1, further comprising:
selectively pairing a character from the array of unsigned integers with a character from the alphanumeric character map to form an index of paired characters that are less than or equal to 32 character pairs; and
storing the index of paired characters.

9. The method of claim 1, further comprising:
in response to receiving, from a trading partner located on an EDI network, an electronic data interchange document with an encoded alphanumeric string of characters, decoding the encoded alphanumeric string of characters by replacing each character of the encoded alphanumeric string of characters with an associated unsigned integer from the index of paired characters; and
converting each of the associated unsigned integers to a binary equivalent; and
forming a string of 128 binary bits.

10. The method of claim 9, further comprising:
converting the string of 128 binary bits to hexadecimal to form a decoded globally unique identifier.

11. The method of claim 10, further comprising:
comparing the decoded globally unique identifier to a previously encoded globally unique identifier to determine when the decoded globally unique identifier is identical to the previously encoded globally unique identifier; and
in response to the decoded globally unique identifier being identical to the previously encoded globally unique identifier, validating the electronic data interchange document as an authentic electronic data interchange document.

12. The method of claim 1, further comprising:
separating the 128 string of binary bits into 26 groups of five bits, with 2 bits added to a last group to create a complete grouping of five; and
translating each of the 26 groups of five binary bits into its decimal equivalent.

13. An information handling system (IHS) comprising:
a storage device storing an electronic data interchange (EDI) software;
a network interface device (NID) that enables a connection to at least one EDI trading partner via an EDI network;
a processor communicatively coupled to the storage device and the NID, the processor having a globally unique identifier conversion utility executing thereon to enable conversion of a globally unique identifier to a unique electronic data interchange identifier, wherein the globally unique identifier conversion utility configures the processor to:
generate an alphanumeric character map;
generate an array of unsigned integers;
assign an alphanumeric character of the alphanumeric character map to an unsigned integer selected from among the array of unsigned integers;
receive a generated globally unique identifier (GUID);
convert the generated globally unique identifier into 128 binary bits;
add bits at an end of the 128 binary bits to generate a longer sequence of binary bits;
selectively group the longer sequence of binary bits to form groups of bits that translate to integers;
replace each integer with an assigned alphanumeric character selected from the alphanumeric character map to form an encoded alphanumeric string of characters that comprises 30 or less characters in length, the encoded alphanumeric string of characters conforming to an electronic data interchange (EDI) standard protocol that function as a unique EDI document identifier;
assign the encoded alphanumeric string of characters as the unique EDI document identifier to an EDI document;
embed the unique EDI document identifier within the EDI document;
transmit, via a network interface device, the EDI document through an EDI network to an electronic system of a trading partner, the EDI document having the unique EDI document identifier embedded therein;
index the generated GUID to an encoded EDI document identifier;
store the indexed generated GUID and encoded EDI document identifier within a table/mapping of generated GUIDs and associated encoded EDI document identifiers; and
in response to receiving an EDI document from the trading partner, compare the received EDI document identifier to the indexed document identifier to determine an originally generated GUID.

14. The IHS of claim 13, wherein to assign the encoded alpha numeric string of characters as the unique EDI document identifier to an EDI document, the globally unique identifier conversion utility further configures the processor to:
embed the encoded alphanumeric string of characters in a transmission identifier field of the EDI.

15. The IHS of claim 14, wherein the globally unique identifier conversion utility further configures the processor to:
in response to receiving a corresponding electronic data interchange document from the trading partner, decode the encoded alphanumeric string of characters to determine an associated, received globally unique identifier.

16. The IHS of claim 15, wherein the globally unique identifier conversion utility further configures the processor to:
compare a received globally unique identifier to the generated globally unique identifier; and
validate authenticity of the corresponding electronic data interchange document.

17. The IHS of claim 13, wherein the globally unique identifier conversion utility further configures the processor to generate the alphanumeric character map as a character array of 32 characters or less.

* * * * *